(12) United States Patent
Bao et al.

(10) Patent No.: US 9,093,452 B2
(45) Date of Patent: Jul. 28, 2015

(54) ELECTRONIC FUSE WITH RESISTIVE HEATER

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Fishkill, NY (US); Ronald G. Filippi, Wappingers Falls, NY (US); Wai-Kin Li, Hopewell Junction, NY (US); Naftali E. Lustig, Croton-on-Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 13/790,399

(22) Filed: Mar. 8, 2013

(65) Prior Publication Data

US 2014/0252538 A1  Sep. 11, 2014

(51) Int. Cl.
*H01L 21/768* (2006.01)
*H01L 23/525* (2006.01)
(Continued)

(52) U.S. Cl.
CPC .......... *H01L 23/5256* (2013.01); *H01L 21/768* (2013.01); *H01L 23/345* (2013.01);
(Continued)

(58) Field of Classification Search
CPC .. H01L 21/768; H01L 23/525; H01L 23/5256
USPC ......... 438/466, 467, 600, 601, 215, 333, 281, 438/135, 128, 131, 132
See application file for complete search history.

(56) References Cited

U.S. PATENT DOCUMENTS 5,169,802 A * 12/1992 Yeh ............................... 438/637
6,498,385 B1  12/2002 Daubenspeck et al.
(Continued)

*Primary Examiner* — Chuong A Luu
(74) *Attorney, Agent, or Firm* — L. Jeffrey Kelly; Catherine Ivers

(57) ABSTRACT

A method of forming an electronic fuse including forming an $M_x$ level including a first and a second $M_x$ metal, forming a first $M_{x+1}$ dielectric above the $M_x$ level, forming a conductive path on a portion of the first $M_{x+1}$ dielectric, forming a second $M_{x+1}$ dielectric above the first $M_{x+1}$ dielectric and above the conductive path, the first and second $M_{x+1}$ dielectrics together form an $M_{x+1}$ level, forming a first and a second via in the $M_{x+1}$ level, the conductive path extending from the first via to the second via and partially encircling the first via, and forming a first and second $M_{x+1}$ metal in the $M_{x+1}$ level, the first via extending vertically and electrically connecting the first $M_x$ metal to the first $M_{x+1}$ metal, and the second via extending vertically and electrically connecting the second $M_x$ metal to the second $M_{x+1}$ metal.

17 Claims, 15 Drawing Sheets

(51) Int. Cl.
   *H01L 23/34*     (2006.01)
   *H01L 23/532*    (2006.01)

(52) U.S. Cl.
   CPC ....... *H01L23/5329* (2013.01); *H01L 23/53223* (2013.01); *H01L 23/53238* (2013.01); *H01L 23/53266* (2013.01); *H01L 23/53295* (2013.01); *H01L 2924/0002* (2013.01)

(56) References Cited

U.S. PATENT DOCUMENTS

| | | | |
|---|---|---|---|
| 6,667,533 B2 * | 12/2003 | Daubenspeck et al. ....... 257/529 |
| 6,746,947 B2 | 6/2004 | Daubenspeck et al. |
| 6,933,191 B2 | 8/2005 | Biery et al. |
| 7,566,593 B2 | 7/2009 | Chinthakindi et al. |
| 7,633,079 B2 | 12/2009 | Chen et al. |
| 7,635,907 B2 | 12/2009 | Ueda |
| 7,704,804 B2 | 4/2010 | Daubenspeck et al. |
| 7,750,335 B2 | 7/2010 | Clevenger et al. |
| 8,018,017 B2 | 9/2011 | Chen et al. |
| 8,236,622 B2 | 8/2012 | Ueda |
| 2006/0163685 A1 | 7/2006 | Chen et al. |
| 2008/0157270 A1 | 7/2008 | Kim et al. |
| 2008/0290984 A1 * | 11/2008 | Wei et al. ...................... 338/309 |
| 2009/0039331 A1 | 2/2009 | Clevenger et al. |
| 2009/0065761 A1 | 3/2009 | Chen et al. |
| 2011/0241162 A1 | 10/2011 | Kurz et al. |
| 2014/0210041 A1 | 7/2014 | Burke et al. |
| 2014/0217612 A1 | 8/2014 | Bao et al. |

* cited by examiner

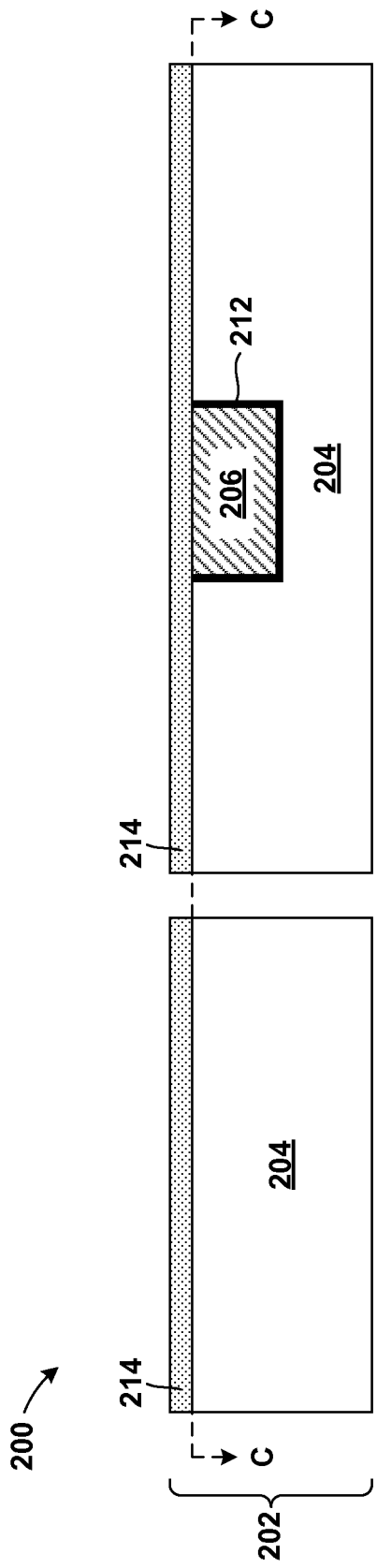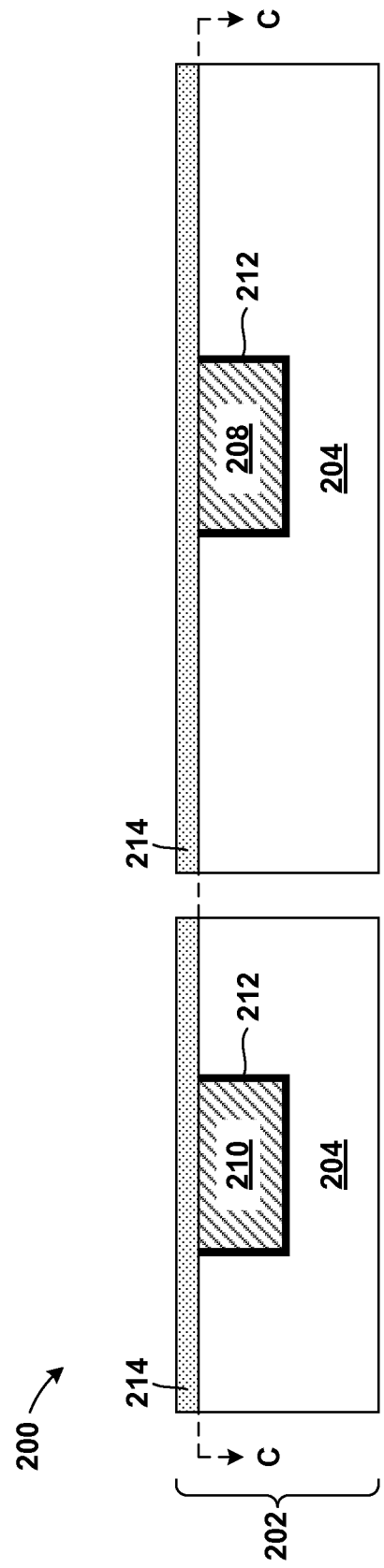

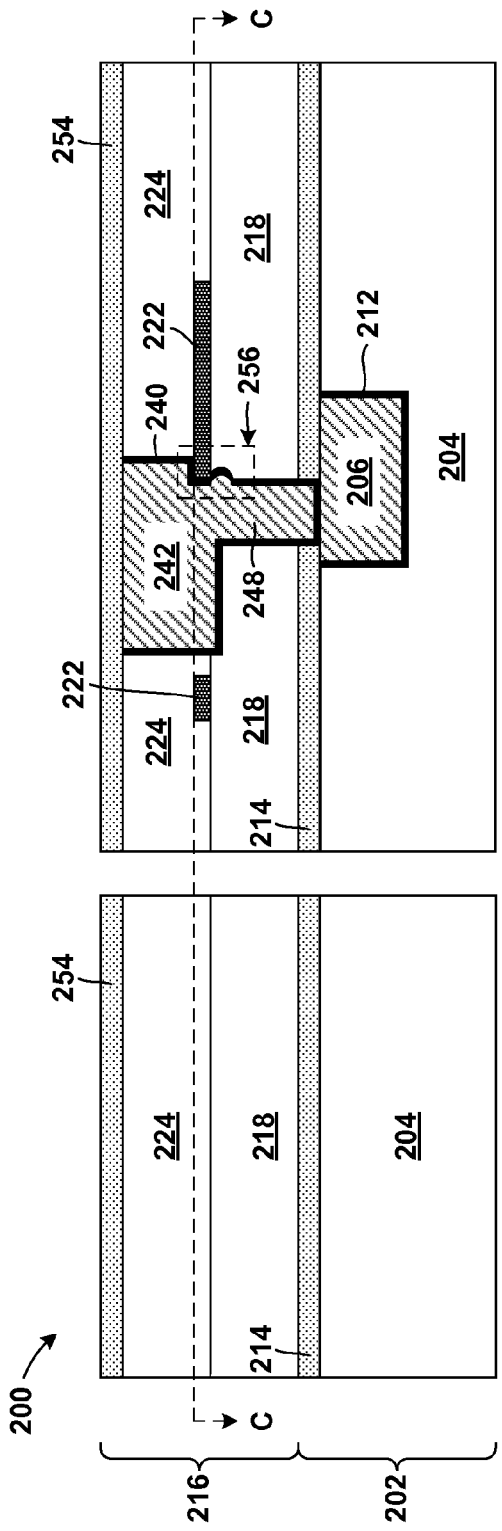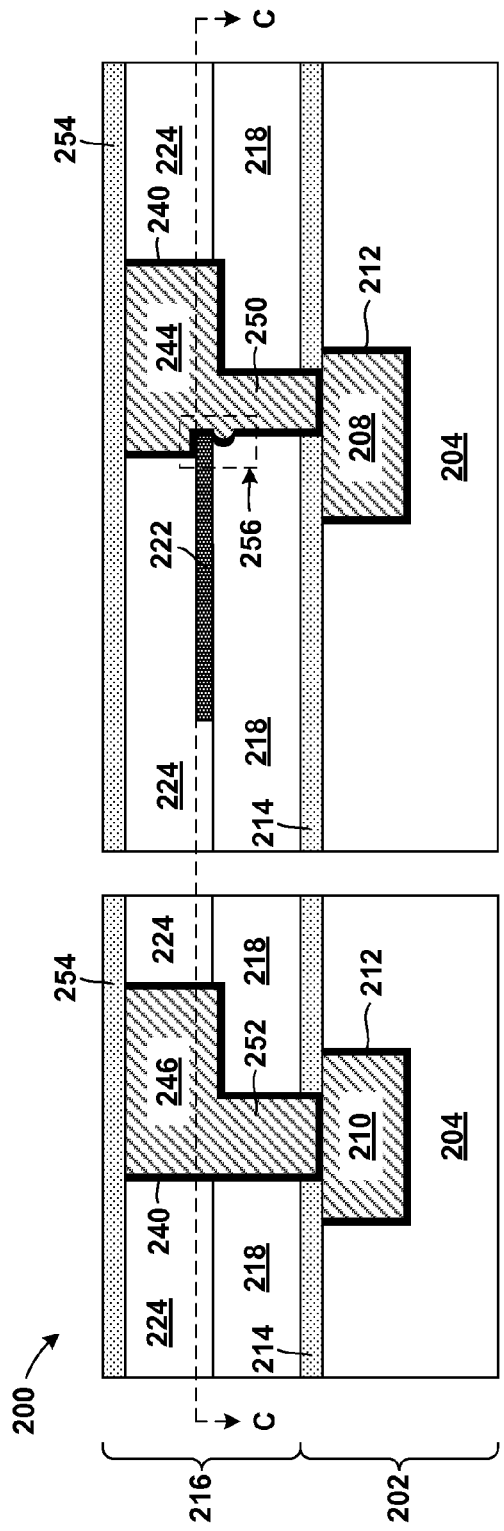

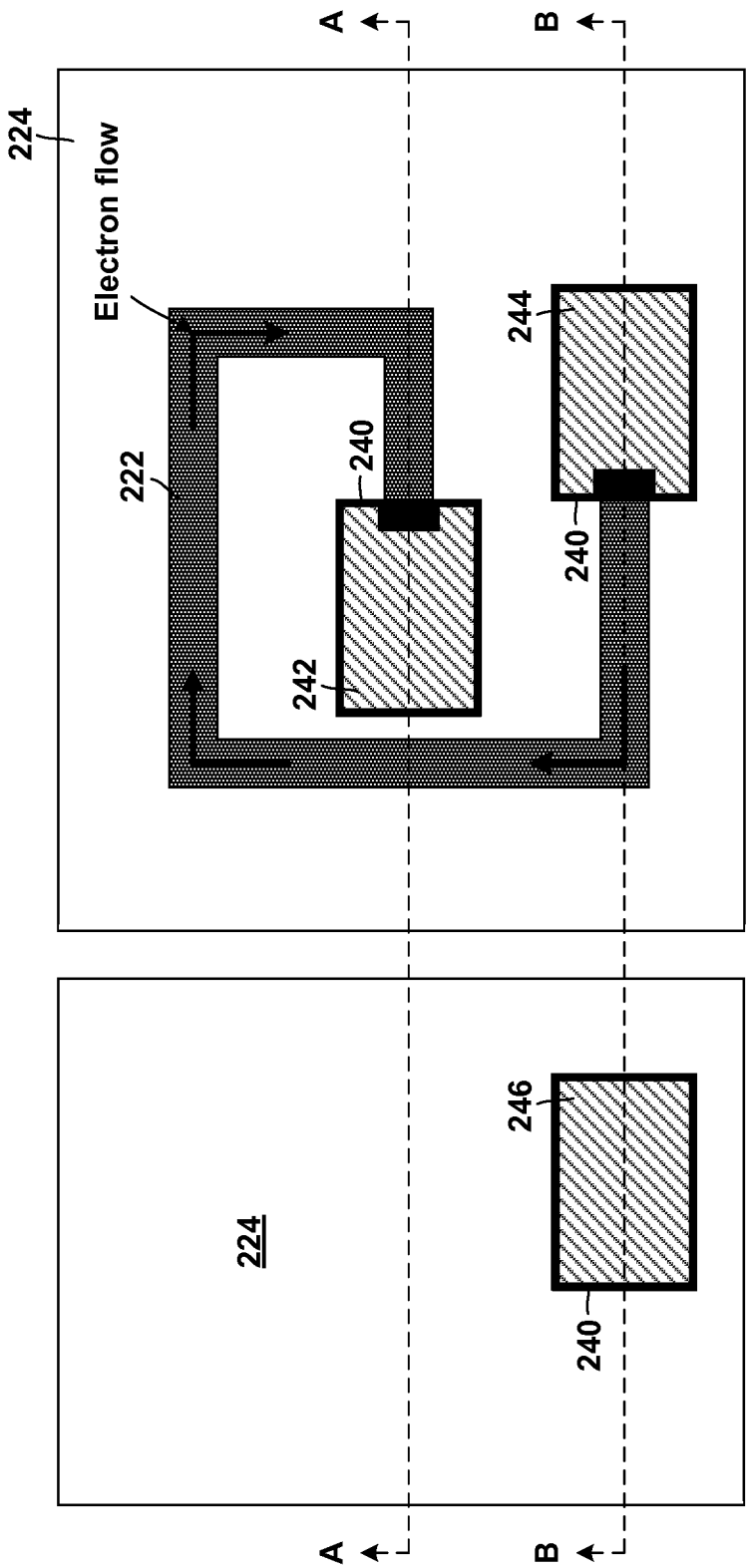

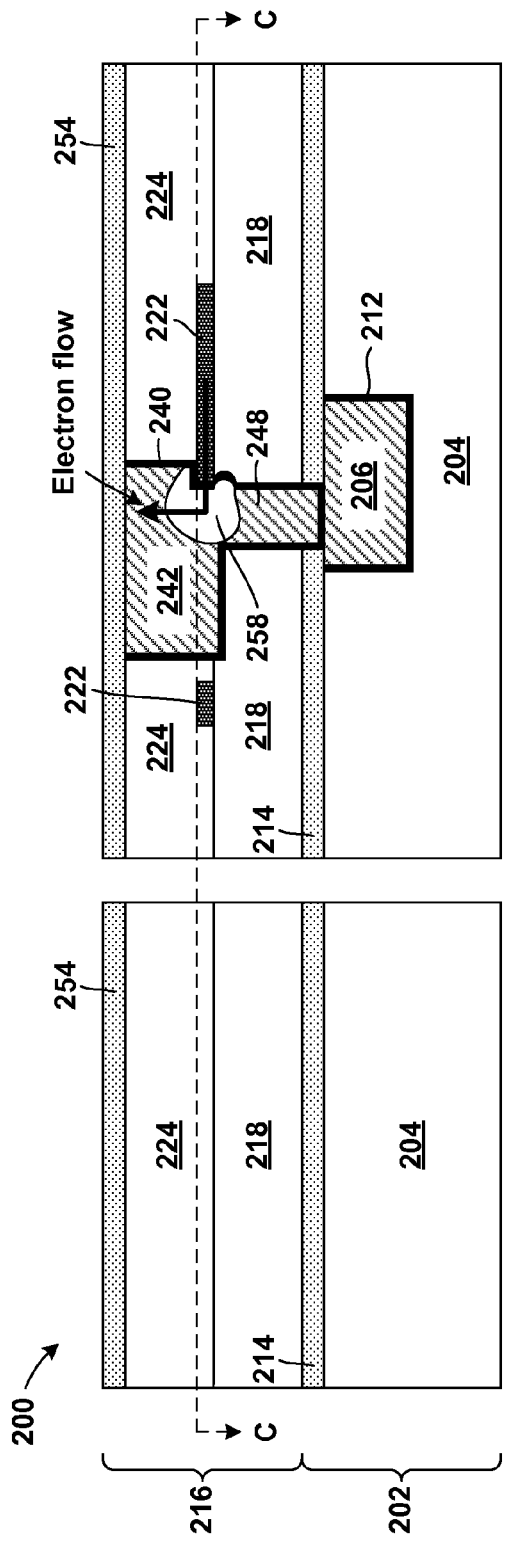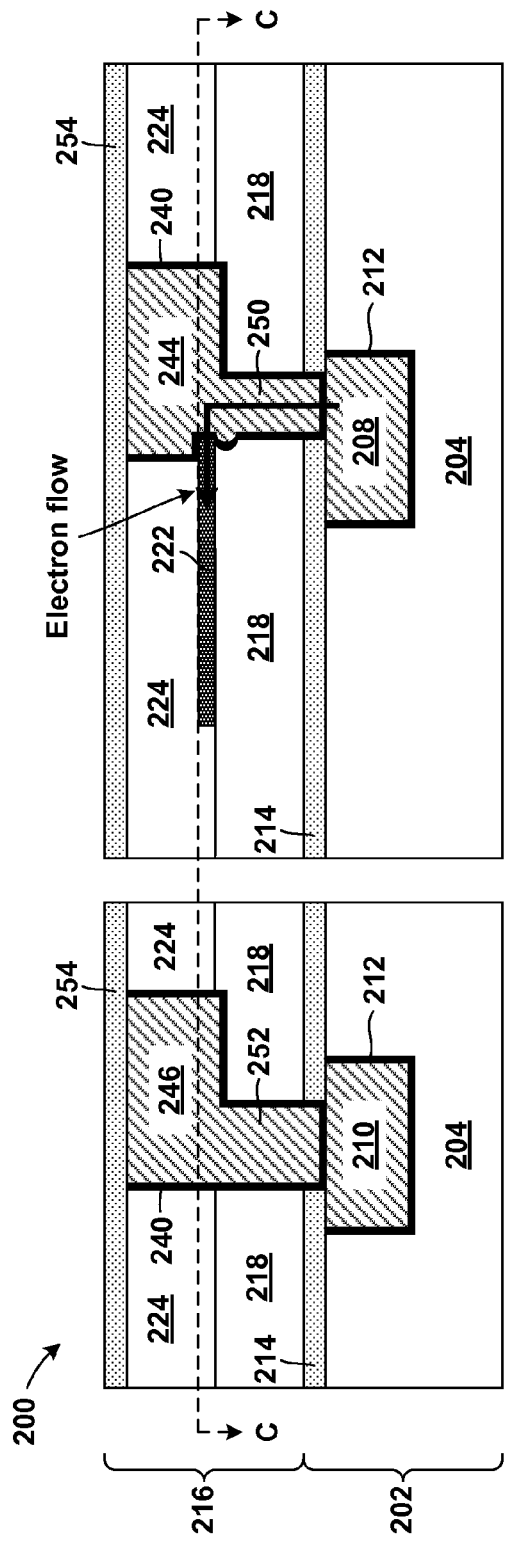

ELECTRONIC FUSE WITH RESISTIVE HEATER

BACKGROUND

1. Field of the Invention

The present invention relates generally to semiconductors, and, more particularly, to electronic fuse interconnect structures having a resistive heater.

2. Background of Invention

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. Electromigration can be defined as the transport of material caused by the gradual movement of ions in a conductor due to the momentum transfer between conducting electrons and diffusing metal atoms. In e-fuses that take advantage of electromigration, such transport of material caused by the gradual movement of ions can produce voids which cause the e-fuse to blow and create the open circuit.

However, in a typical e-fuse, electromigration may cause unpredictable voids, thus potentially creating an open circuit in undesirable locations. Furthermore, typical e-fuse programming may require high programming currents and long programming times. Such programming currents and times may result in unpredictable void formation during programming which may negatively affect other circuits adjacent to the e-fuse. Therefore, it may be desirable to program an e-fuse with lower programming currents and shorter programming times. In addition, predictable and repeatable void formation may also be preferred.

Accordingly, there exists a need in the art to overcome the deficiencies and limitations described hereinabove.

SUMMARY

According to one embodiment, a method of forming an electronic fuse is provided. The method may include forming an $M_x$ level including a first $M_x$ metal, and a second $M_x$ metal, forming a first $M_{x+1}$ dielectric above the $M_x$ level, and forming a conductive path on a portion of the first $M_{x+1}$ dielectric above the first $M_x$ metal and above the second $M_x$ metal. The method may further include forming a second $M_{x+1}$ dielectric above the first $M_{x+1}$ dielectric and above the conductive path, the first $M_{x+1}$ dielectric and the second $M_{x+1}$ dielectric together form an $M_{x+1}$ level, forming a first via and a second via in the $M_{x+1}$ level, the conductive path extending from the first via to the second via and partially encircling the first via, and forming a first $M_{x+1}$ metal and a second $M_{x+1}$ metal in the $M_{x+1}$ level, the first via extending vertically and electrically connecting the first $M_x$ metal to the first $M_{x+1}$ metal, and the second via extending vertically and electrically connecting the second $M_x$ metal to the second $M_{x+1}$ metal.

According to another embodiment, an electronic fuse structure is provided. The electronic fuse structure may include an $M_x$ level including a first $M_x$ metal, and a second $M_x$ metal, and an $M_{x+1}$ level including a first $M_{x+1}$ metal, a second $M_{x+1}$ metal, a first via, a second via, and a conductive path extending from the first via to the second via and partially encircling the first via, the first via extending vertically and electrically connecting the first $M_x$ metal to the first $M_{x+1}$ metal, and the second via extending vertically and electrically connecting the second $M_x$ metal to the second $M_{x+1}$ metal.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIGS. 3-20 illustrate the steps of a method of forming an e-fuse according to an exemplary embodiment.

FIG. 3 is a cross section view of FIG. 3, section A-A.

FIG. 4 is a cross section view of FIG. 3, section B-B.

FIG. 5 is a top view depicting the formation of a conductive layer according to an exemplary embodiment.

FIG. 6 is a cross section view of FIG. 5, section A-A.

FIG. 7 is a cross section view of FIG. 5, section B-B.

FIG. 8 is a top view depicting the removal of a portion of the conductive layer to form a conductive path according to an exemplary embodiment.

FIG. 9 is a cross section view of FIG. 8, section A-A.

FIG. 10 is a cross section view of FIG. 8, section B-B.

FIG. 11 is a top view depicting the formation of a first via opening, a second via opening, and a third via opening according to an exemplary embodiment.

FIG. 12 is a cross section view of FIG. 11, section A-A.

FIG. 13 is a cross section view of FIG. 11, section B-B.

FIG. 14 is a top view depicting the formation of a first trench, a second trench, and a third trench according to an exemplary embodiment.

FIG. 15 is a cross section view of FIG. 14, section A-A.

FIG. 16 is a cross section view of FIG. 14, section B-B.

FIG. 17 is a top view depicting the final e-fuse structure after programming according to an exemplary embodiment.

FIG. 18 is a cross section view of FIG. 17, section A-A.

FIG. 19 is a cross section view of FIG. 17, section B-B.

FIG. 20 is a top view depicting the final e-fuse structure after programming according to an exemplary embodiment.

FIG. 21 is a cross section view of FIG. 20, section A-A.

FIG. 22 is a cross section view of FIG. 20, section B-B.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates generally to an e-fuse structure, and more particularly, an e-fuse structure having a defective region. The e-fuse structure may include the defective region adjacent to an intersection between a via and a thin conductive material located in an $M_{x+1}$ level. In some cases, the e-fuse structure may include more than one defective region. The defective regions, may in some cases, be defined by poor liner coverage and small voids located in the conductive material.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the front-end-of-line (FEOL) while the connections to and between those semiconductor devices may be formed in the BEOL. The present invention thus allows the e-fuse to be fabricated during normal interconnect process flows, thus advantageously reducing processing costs for manufacturing e-fuses which are normally fabricated in different process flows.

More specifically, multilayer electronic components include multiple layers of a dielectric material having metallization on each layer in the form of, for example, vias, pads, straps connecting pads to vias, and wiring. Vias or other openings in the dielectric layer extend from one layer to another layer. These openings are filled with a conductive material and electrically connect the metallization of one layer to the metallization of another layer and provide for the high density electronic component devices now used in industry. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, nitride. In the present case, the fuse line may be referred to as the metallization of a dielectric layer as described above.

Figure 1:
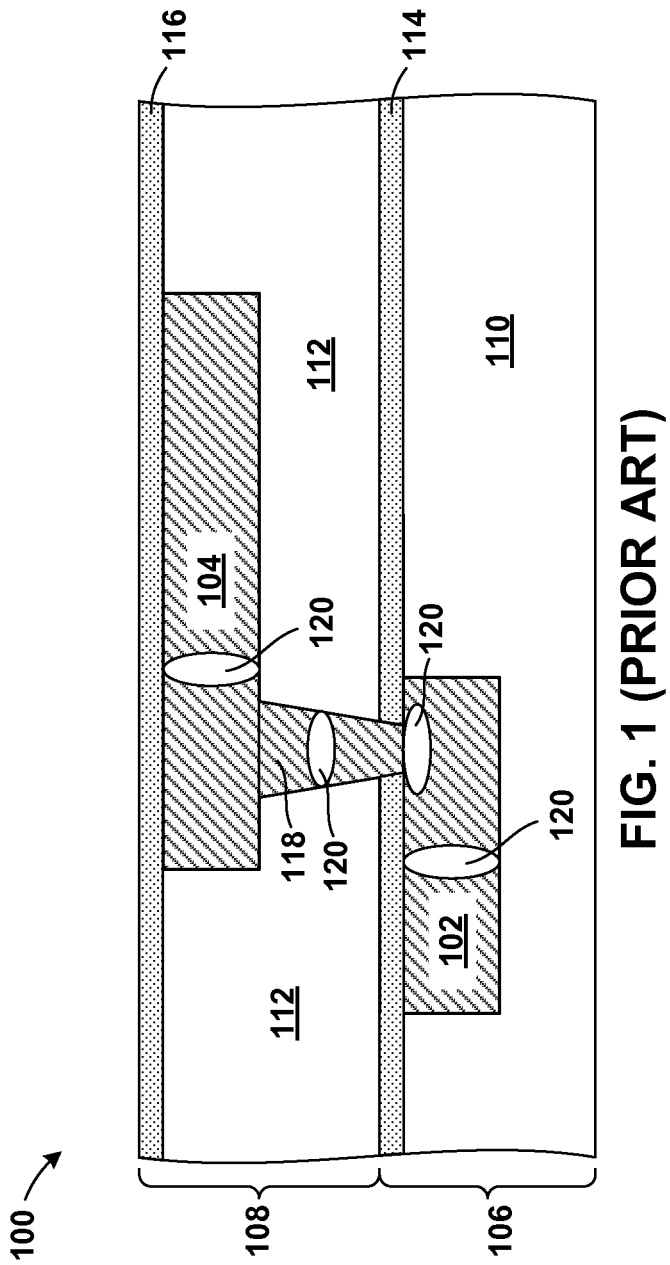
FIG. 1 is a cross-sectional view depicting a vertical e-fuse after programming according to the prior art.

By way of example FIG. 1 illustrates a structure 100 having a typical e-fuse structure in which the electromigration failure mode of the e-fuse structure after programming is depicted. The e-fuse may include an $M_x$ level 106, an $M_{x+1}$ level 108, and a via 118. The $M_x$ level 106 may include an $M_x$ dielectric 110 and an $M_x$ metal 102. The $M_{x+1}$ level 108 may include an $M_{x+1}$ dielectric 112 and an $M_{x+1}$ metal 104. An $M_x$ cap dielectric 114 may be located between the $M_x$ dielectric 110 and the $M_{x+1}$ dielectric 112 and electrically insulate the $M_x$ metal 102 from the $M_{x+1}$ metal 104. An $M_{x+1}$ cap dielectric 116 may be located above the $M_{x+1}$ dielectric 112 and electrically insulate the $M_{x+1}$ metal 104 layer from additional interconnect levels (not shown) that may be subsequently formed above.

The via 118 electrically connects the $M_x$ metal 102 to the $M_{x+1}$ metal 104. The $M_x$ metal 102, the $M_{x+1}$ metal 104, and the via 118 make up the typical e-fuse. The e-fuse is a structure that may be blown in accordance with the application of a suitable electrical current. For example, an electrical current may be provided through the e-fuse to eventually cause the e-fuse to blow and create an open circuit. Programming refers to blowing an e-fuse and creating the open circuit. A suitable electrical current depends on the e-fuse design and may range from about 10 mA to about 25 mA, and ranges there between. Alternatively, programming may occur at a threshold current density. For example, a typical current density of about 100 $mA/cm^2$ may be required to program the e-fuse. Additionally, a circuit is considered to be programmed, and open, when the e-fuse resistance increases more than an order of magnitude over the initial pre-programmed resistance of the e-fuse. During programming of the e-fuse, one or more voids 120 may form in unexpected locations due to non-optimized processing. Location of the voids 120 may be uncontrollable and may affect the yield and reliability of the e-fuse. The voids 120 are due in part to the electromigration of conductive interconnect material within the e-fuse. For example, one void 120 may be located in the $M_x$ metal 102 and cause the e-fuse to blow at the $M_x$ metal 102. Therefore, an open circuit is formed at the $M_x$ metal 102 during programming. An open circuit may be the desired result of programming the e-fuse, however, an open circuit in the $M_x$ metal 102 may affect other circuits (not shown) that may be connected to the $M_x$ metal 102. It should be noted that multiple voids are depicted as illustrative examples, and depending on the direction of the current, the voids 120 may form in the $M_x$ metal 102, the via 118, or the $M_{x+1}$ metal 104.

Ideally, low programming currents and short programming times are preferable when programming an e-fuse. One way to achieve lower programming currents and shorter programming times may include introducing a defective region by which may improve electromigration, and thereby encourage faster e-fuse programming at lower currents. One embodiment to improve e-fuse programming by introducing a defective region is described in detail below by referring to the accompanying drawings FIGS. 3-23. In the present embodiment, two vias in a fuse region are joined by a resistive heater which may cause the formation of a defective region and increased heat during programming.

Figure 2:
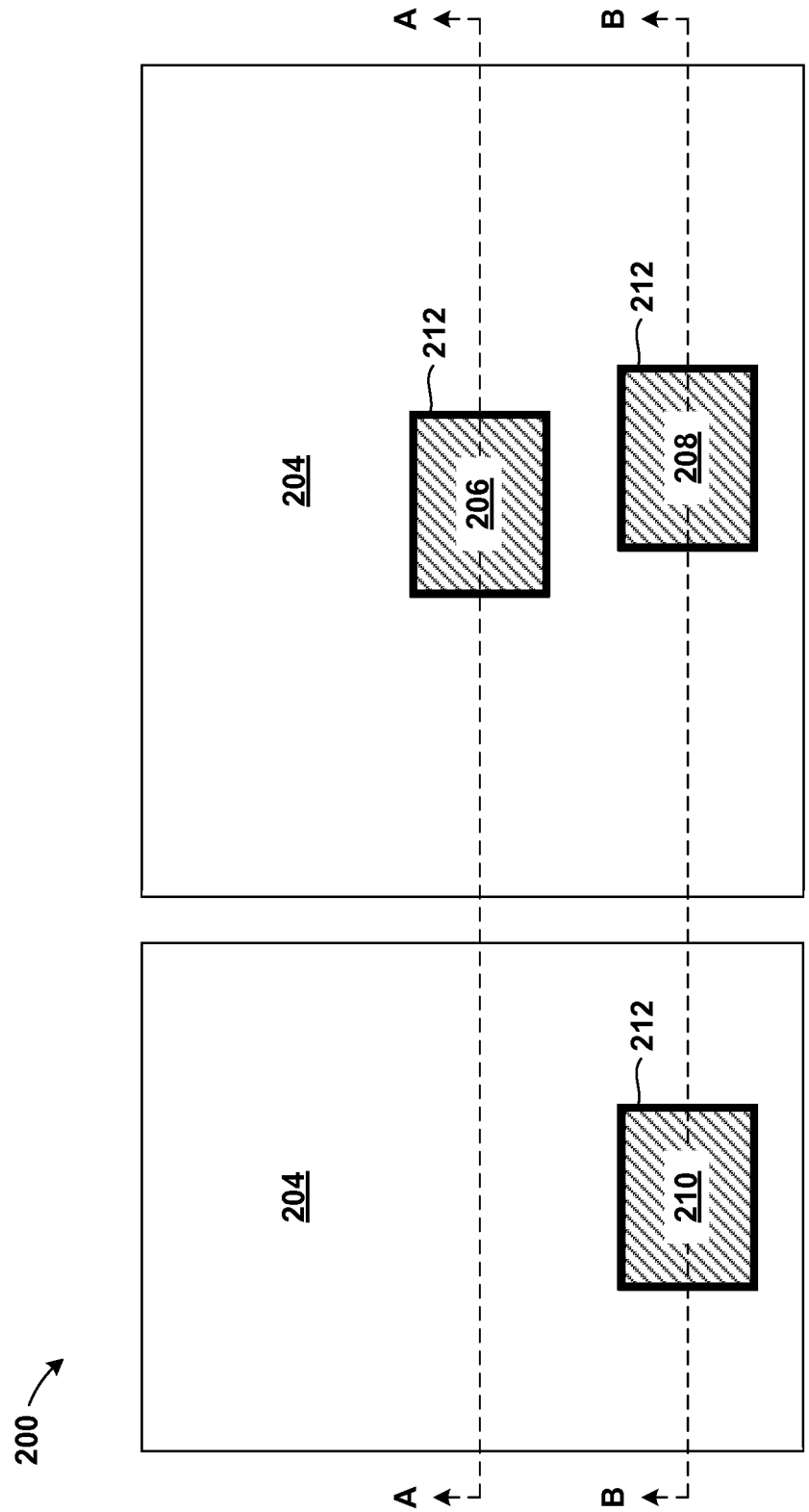
FIG. 2 is a top view depicting an $M_x$ level having a first $M_x$ metal, a second $M_x$ metal, a third $M_x$ metal according to an exemplary embodiment.

Referring now to FIGS. 2, 3, and 4, multiple cross section views of a structure 200 are shown. FIGS. 3 and 4 are each a cross section view of FIG. 2, section A-A and section B-B, respectively. FIG. 2 is a horizontal cross section view of both FIGS. 3 and 4, section C-C. The structure 200 may include an $M_x$ level 202. The $M_x$ level 202 may include an $M_x$ dielectric 204, a first $M_x$ metal 206, a second $M_x$ metal 208, a third $M_x$ metal 210, and an $M_x$ cap dielectric 214. The $M_x$ level 202 may be any interconnect level in the structure 200. The $M_x$ dielectric 204 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, plasma enhanced chemical vapor deposition, spin on deposition, or physical vapor deposition may be used to form the $M_x$ dielectric 204. The $M_x$ dielectric 204 may have a typical thickness ranging from about 100 nm to about 150 nm and ranges there between, although a thickness less than 100 nm and greater than 150 nm may be acceptable. It should be noted that while only a single interconnect level is shown, the structure 200 may have multiple interconnect levels above and below the $M_x$ level 202. It should also be noted that the left side of FIG. 2 is intended to depict a non-fuse region of the structure 200, and the right side of FIG. 2 is intended to depict a fuse region of the structure 200.

The first $M_x$ metal 206, the second $M_x$ metal 208, and the third $M_x$ metal 210, may be formed in the $M_x$ dielectric 204 in accordance with typical lithography techniques. The first $M_x$ metal 206 and the second $M_x$ metal 208 may consist of a typical line or wire which will form the base structure for an e-fuse, and the third $M_x$ metal 210 may consist of a typical line or wire found in a typical semiconductor circuit. The first $M_x$ metal 206, the second $M_x$ metal 208, and the third $M_x$ metal 210 may be substantially similar structures and may be fabricated using, for example, a typical single or dual damascene technique in which a conductive interconnect material may be deposited in a trench formed in the $M_x$ dielectric 204.

In one embodiment, the first $M_x$ metal 206, the second $M_x$ metal 208, and the third $M_x$ metal 210 may include various barrier liners, for example, an $M_x$ liner 212. The $M_x$ liner 212 may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIGS. 2, 3, and 4, the $M_x$ cap dielectric 214 may be deposited over the structure 200. The $M_x$ cap dielectric 214 may electrically insulate the $M_x$ level 202 from additional interconnect levels (not shown) that may be subsequently formed above the $M_x$ level 202. The $M_x$ cap dielectric 214 may be deposited using typical deposition techniques, for example, chemical vapor deposition. The $M_x$ cap dielectric 214 may include, for example, silicon nitride ($Si_3N_4$), silicon carbide (SiC), silicon carbon nitride (SiCN), hydrogenated silicon carbide (SiCH), or other known capping materials. The $M_x$ cap dielectric 214 may have a thickness ranging from about 20 nm to about 60 nm and ranges there between, although a thickness less than 20 nm and greater than 60 nm may be acceptable.

Figure 5:
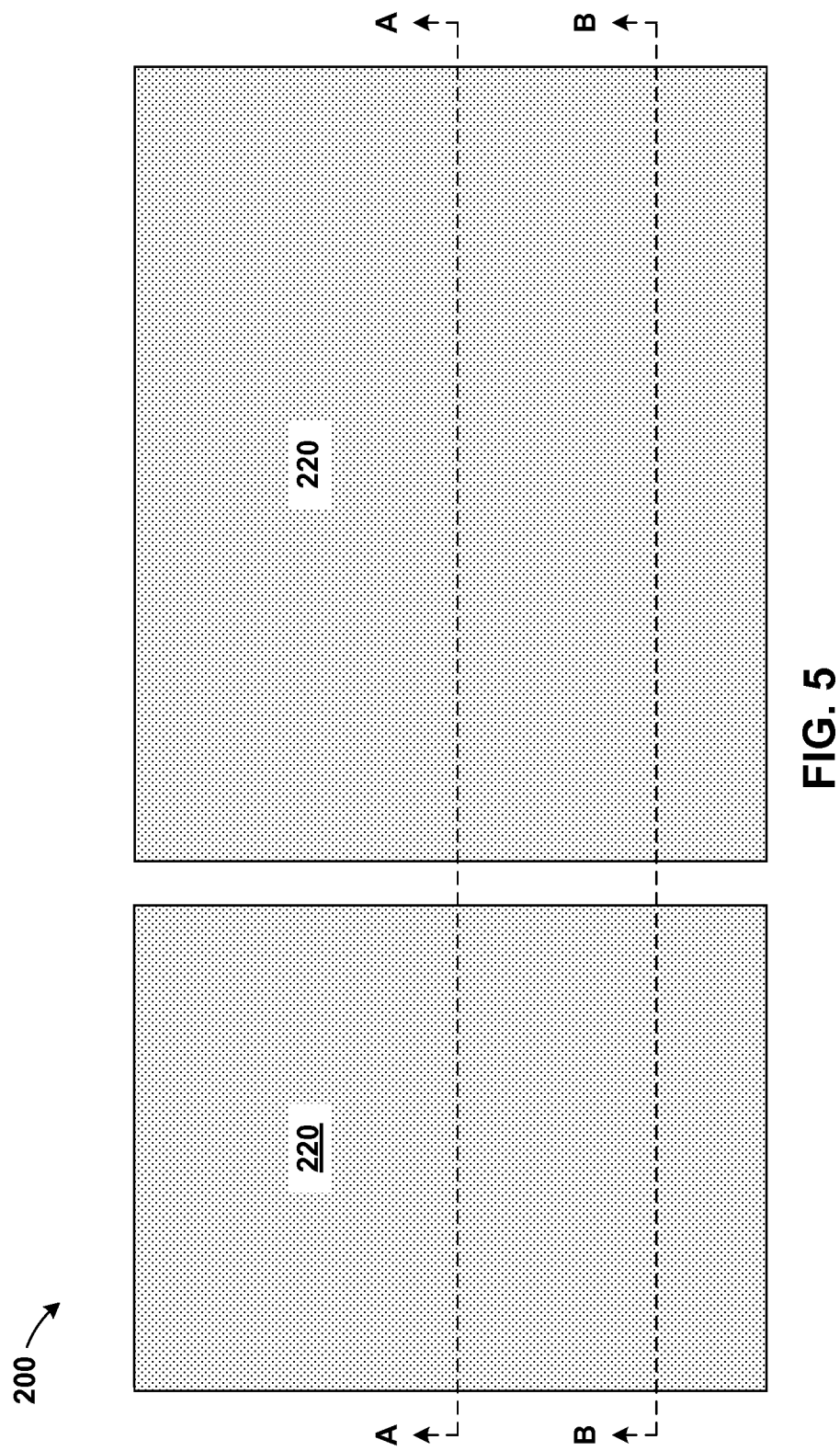
Figure 6:
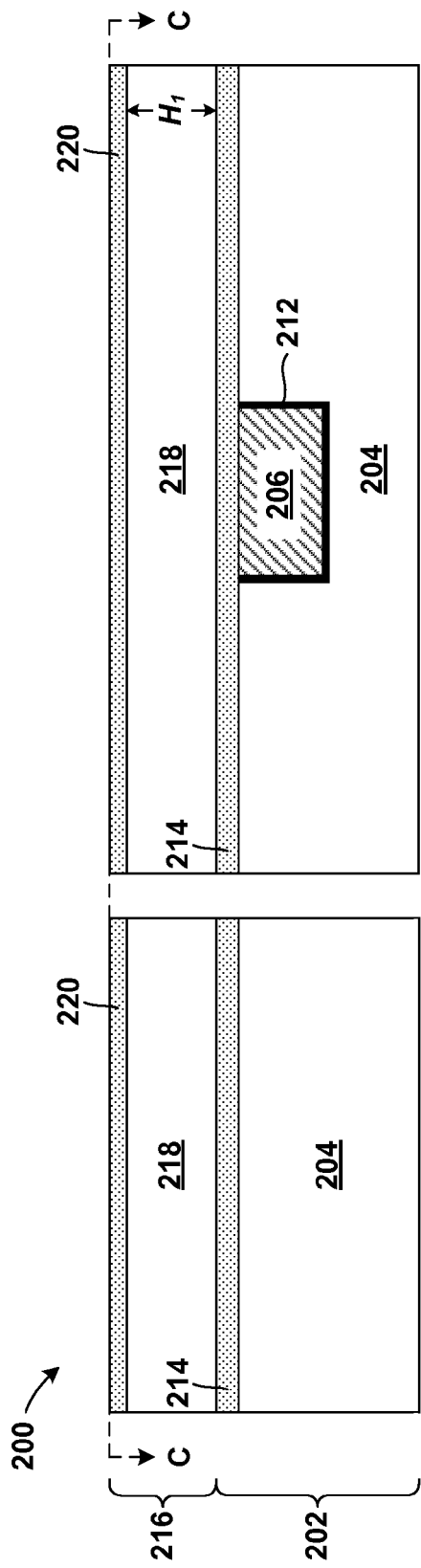
Figure 7:
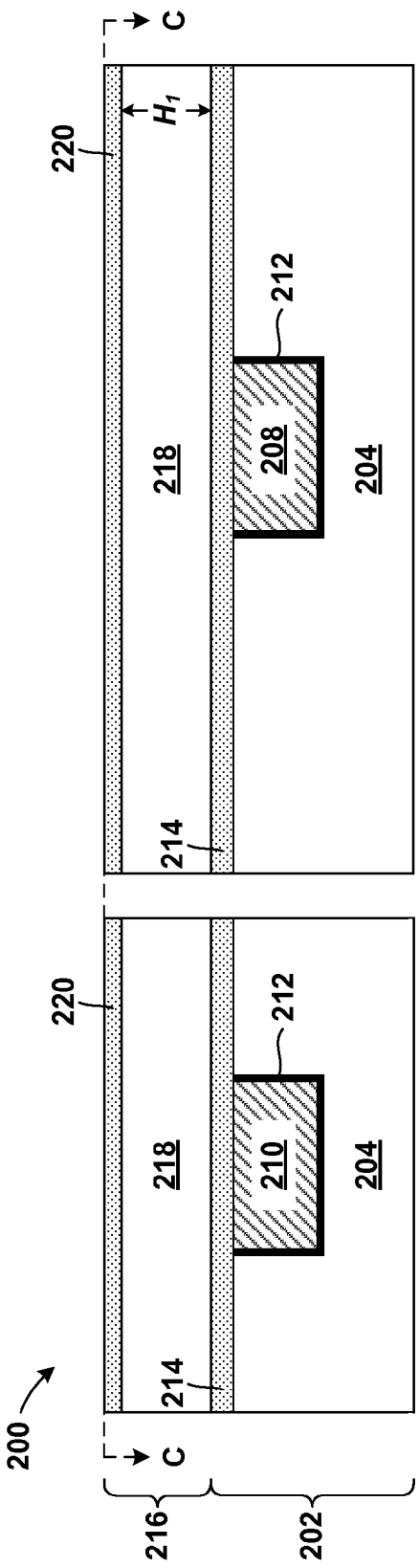

Referring now to FIGS. 5, 6, and 7, the beginning layers of an $M_{x+1}$ level 216 may be formed above the $M_x$ level 202. FIGS. 6 and 7 are each a cross section view of FIG. 5, section A-A and section B-B, respectively. FIG. 5 is a horizontal cross section view of both FIGS. 6 and 7, section C-C. At this step, the $M_{x+1}$ level 216 may include a first $M_{x+1}$ dielectric 218 and a conductive layer 220. Like the $M_x$ level 202, the $M_{x+1}$ level 216 may be any interconnect level in the structure 200, except for the $M_x$ level 202. The first $M_{x+1}$ dielectric 218 may include similar materials and may be formed by a similar process as the $M_x$ dielectric 204 described above. However, the first $M_{x+1}$ dielectric 218 may have a thickness ($H_1$) less than the thickness of the $M_x$ dielectric 204. For example, the first $M_{x+1}$ dielectric 218 may have a thickness ($H_1$) ranging from about 50 nm to about 75 nm and ranges there between, although a thickness less than 50 nm and greater than 75 nm may be acceptable.

The conductive layer 220 may include any suitable metal hardmask, that which may have a higher electrical resistivity than the conductive interconnect material described above. In one embodiment, for example, the conductive layer 220 may include titanium nitride (TiN), tungsten nitride (WN), tantalum nitride (TaN), or tungsten silicon nitride (WSiN). Known suitable deposition techniques, such as, for example, atomic layer deposition, chemical vapor deposition, plasma enhanced chemical vapor deposition, spin on deposition, or physical vapor deposition may be used to form the conductive layer 220. The conductive layer 220 may have a typical thickness ranging from about 2 nm to about 5 nm and ranges there between, although a thickness less than 2 nm and greater than 5 nm may be acceptable.

Figure 8:
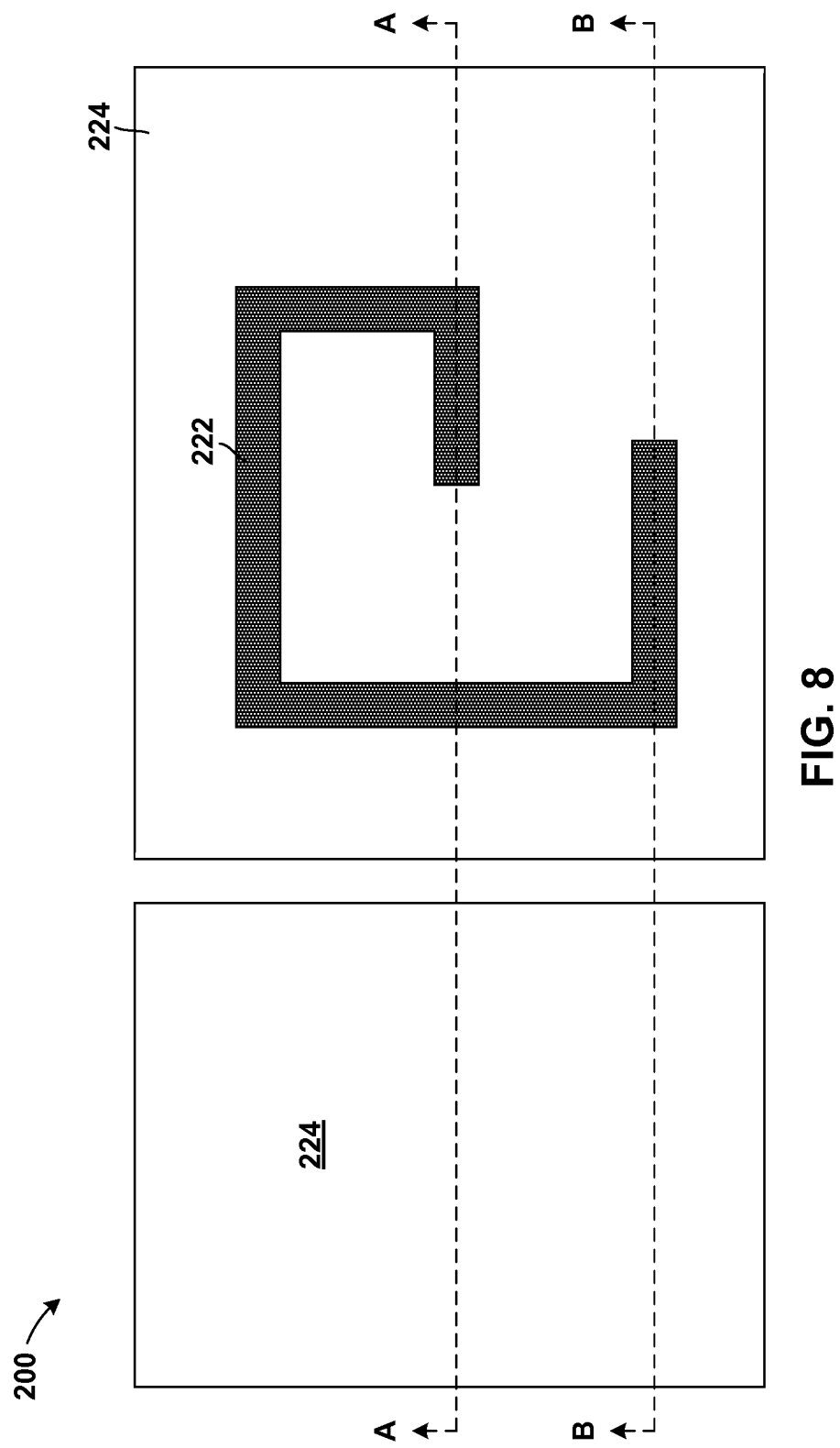
Figure 9:
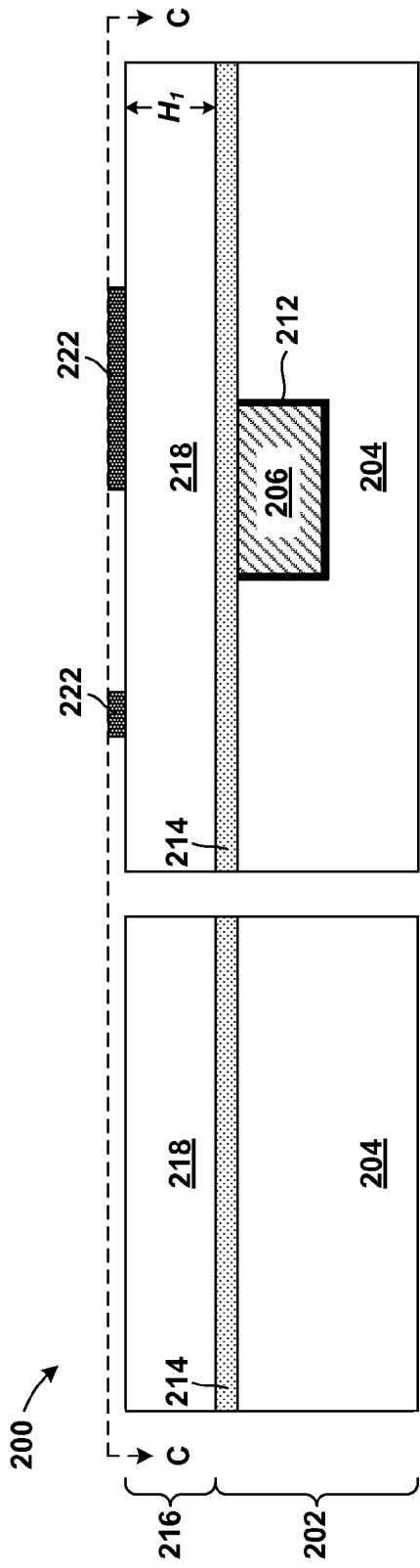
Figure 10:
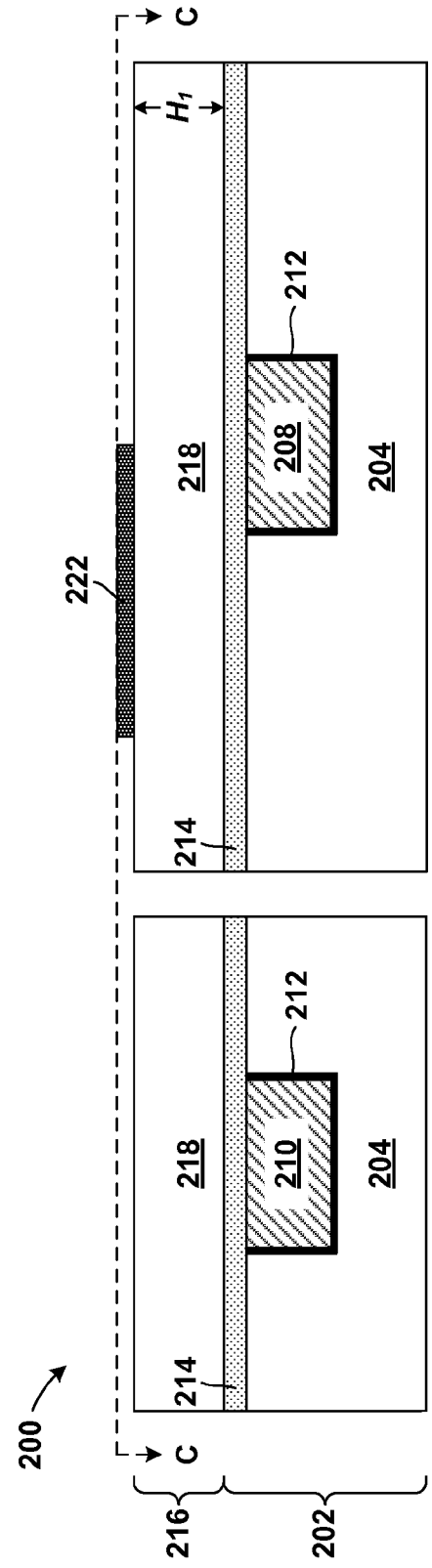

Referring now to FIGS. 8, 9, and 10, some of the conductive layer 220 (FIG. 5) may be removed using known typical lithography and masking techniques. FIGS. 9 and 10 are each a cross section view of FIG. 8, section A-A and section B-B, respectively. FIG. 8 is a horizontal cross section view of both FIGS. 9 and 10, section C-C. In one embodiment, any typical lithography technique may be used pattern the conductive layer 220 (FIG. 5). For example, a hardmask may be applied and a suitable etching technique may be used to remove the unwanted portions of the conductive layer 220 (FIG. 5). In one embodiment, the conductive layer 220 (FIG. 5) may include tantalum nitride (TaN) and a dry etching technique using a chlorine based etchant may be used to remove a portion of the conductive layer 220. A conductive path 222 may remain in the fuse region of the structure 200, as depicted. It should be noted that one end of the conductive path 222 may generally be positioned above the first $M_x$ metal 206 and the other end of the conductive path 222 may be positioned above the second $M_x$ metal 208. In one embodiment, the conductive path 222 may include a width ranging from about 20 nm to about 40 nm, and ranges there between.

Figure 11:
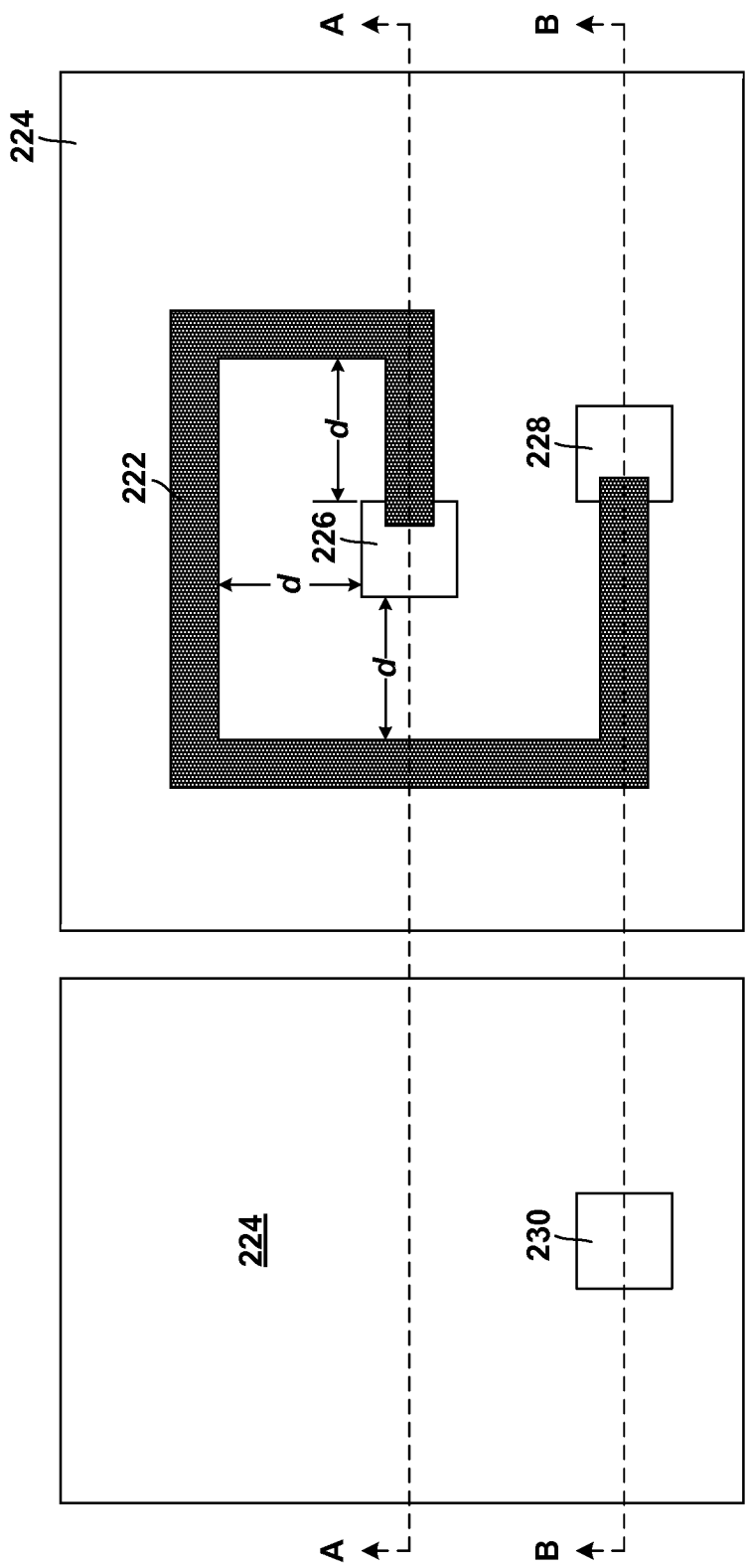
Figure 12:
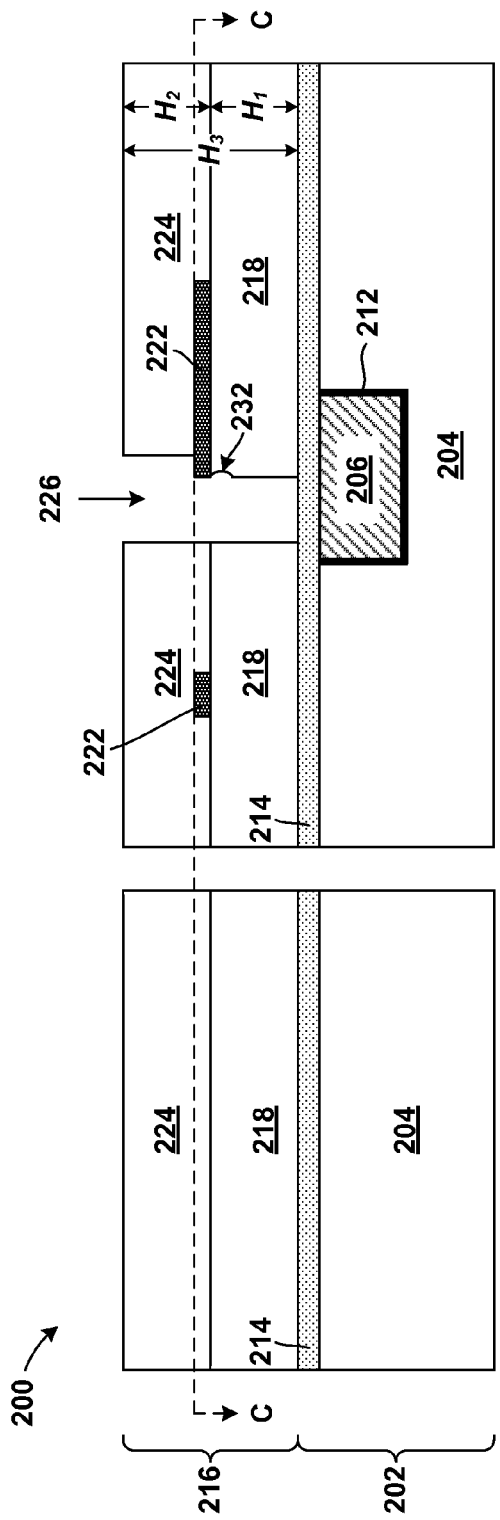
Figure 13:
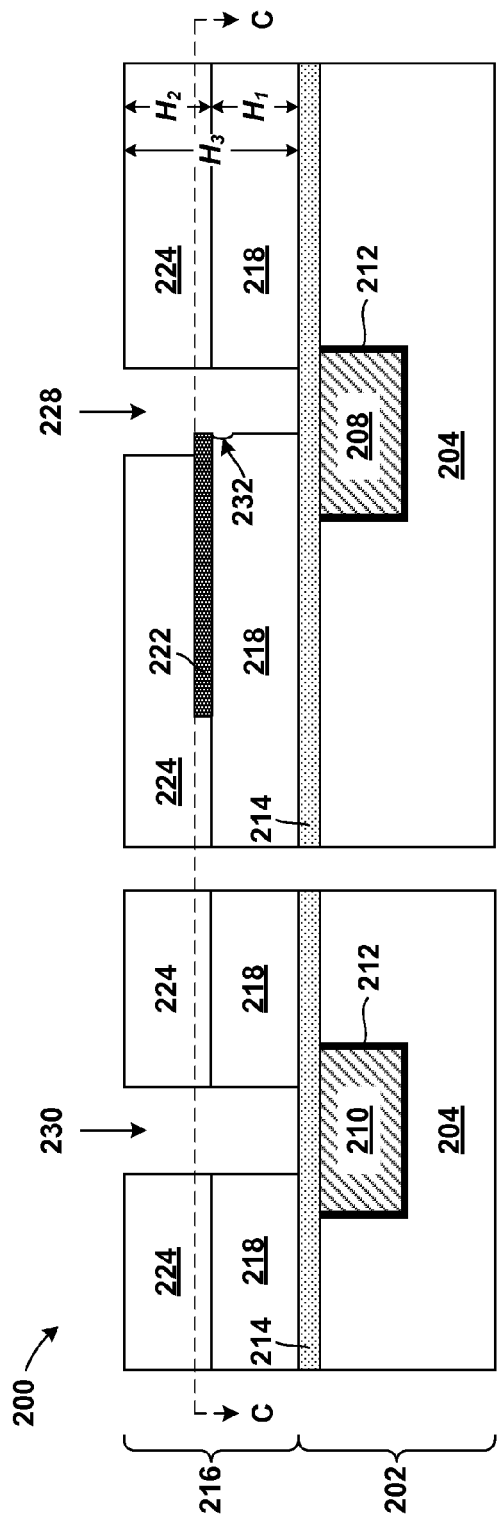

Referring now to FIGS. 11, 12, and 13, a second $M_{x+1}$ dielectric 224 may be formed on top of the first $M_{x+1}$ dielectric 218 and the conductive path 222. FIGS. 12 and 13 are each a cross section view of FIG. 11, section A-A and section B-B, respectively. FIG. 11 is a horizontal cross section view of both FIGS. 12 and 13, section C-C. The second $M_{x+1}$ dielectric 224 may include similar materials and may be formed by a similar process as the $M_x$ dielectric 204 described above. Like the first $M_{x+1}$ dielectric 218, the second $M_{x+1}$ dielectric 224 may have a thickness ($H_2$) less than the thickness of the $M_x$ dielectric 204. For example, the second $M_{x+1}$ dielectric 224 may have a thickness ($H_2$) ranging from about 50 nm to about 75 nm and ranges there between, although a thickness less than 50 nm and greater than 75 nm may be acceptable. The total thickness ($H_3$) of both the first and second $M_{x+1}$ dielectrics 218, 224 may be substantially equal to the thickness of the $M_x$ dielectric 204. The first $M_{x+1}$ dielectric 218 and the second $M_{x+1}$ dielectric 224 may together be referred to as the $M_{x+1}$ level 216. It may be noted that the conductive path 222 may be located approximately in the middle of the $M_{x+1}$ level 216, and be substantially surrounded by the $M_{x+1}$ dielectric (218, 224).

A first via opening 226, a second via opening 228, and a third via opening 230 may be formed in the $M_{x+1}$ level 216. The first via opening 226 may be formed above the first $M_x$ metal 206 in the fuse region of the structure 200. The second via opening 228 may be formed above the second $M_x$ metal 208 in the fuse region of the structure 200. The third via opening 230 may be formed above the third $M_x$ metal 210 in the non-fuse region of the structure 200. The first via opening 226, the second via opening 228, and the third via opening 230 may be formed using any suitable masking and etching technique known in the art, and may include one or more etching steps. First, in one embodiment, a particular etching technique having selective chemistry may be chosen to etch the first via opening 226, the second via opening 228, and the third via opening 230 in the $M_{x+1}$ level 216. Thus, the etching chemistry may preferably etch the first $M_{x+1}$ dielectric 218 and the second $M_{x+1}$ dielectric 224 selective to the conductive path 222. For example, a dry etching technique using a fluorine based etchant may be used. In one embodiment, for example, a very selective etchant chemistry such as $C_4F_8$ may be used; however, the conductive path 222 and a portion of the $M_x$ cap dielectric 214 located at the bottom of the via openings may remain because of the selectivity of the chosen etching technique.

In one embodiment, the conductive path 222 and the selectivity of the corresponding etching technique may partially block via formation, and result in an undersized via opening in the fuse region of the structure 200. In such cases the resulting via located in the fuse region may be about 30% to about 80% the size of a via in the non-fuse region of the structure 200. The undersized via may contribute to lower programming currents.

The selectivity of the etching technique may refer to a difference between the etch rates of two materials relative to the same etching technique. For example, when using a $C_4F_8$ etchant in the present embodiment, the etch rate of the first and second $M_{x+1}$ dielectrics 218, 224 may be greater than the etch rate of the conductive path 222. Therefore, due to the difference in the etch rates the first $M_{x+1}$ dielectric 218 and the second $M_{x+1}$ dielectric 224 may etch significantly faster than the conductive path 222, thus causing the first and second via openings 226, 228 to have multiple widths, as depicted in FIGS. 12 and 13. The two different widths of the first and second via openings 226, 228 may be created due to the presence of the conductive path 222. Because of the etch chemistry selectivity, the conductive path 222 may effectively function as an etch stop, and prevent the etching of a portion of the via openings (226, 228).

One or more undercut features 232 may be produced during the formation of the first and second via openings 226, 228. The presence of the conductive path 222 may function like a hardmask and induce the formation of the undercut features 232. The undercut features 232 may be formed by the isotropic characteristics of the etching technique used to form the via openings (226, 228). It should be noted that one undercut feature 232 may exist at one end of the conductive path 222 along the side wall of the first via opening 226, and another undercut feature 232 may exist at another end of the conductive path 222 along the side wall of the second via opening 228.

Figure 14:
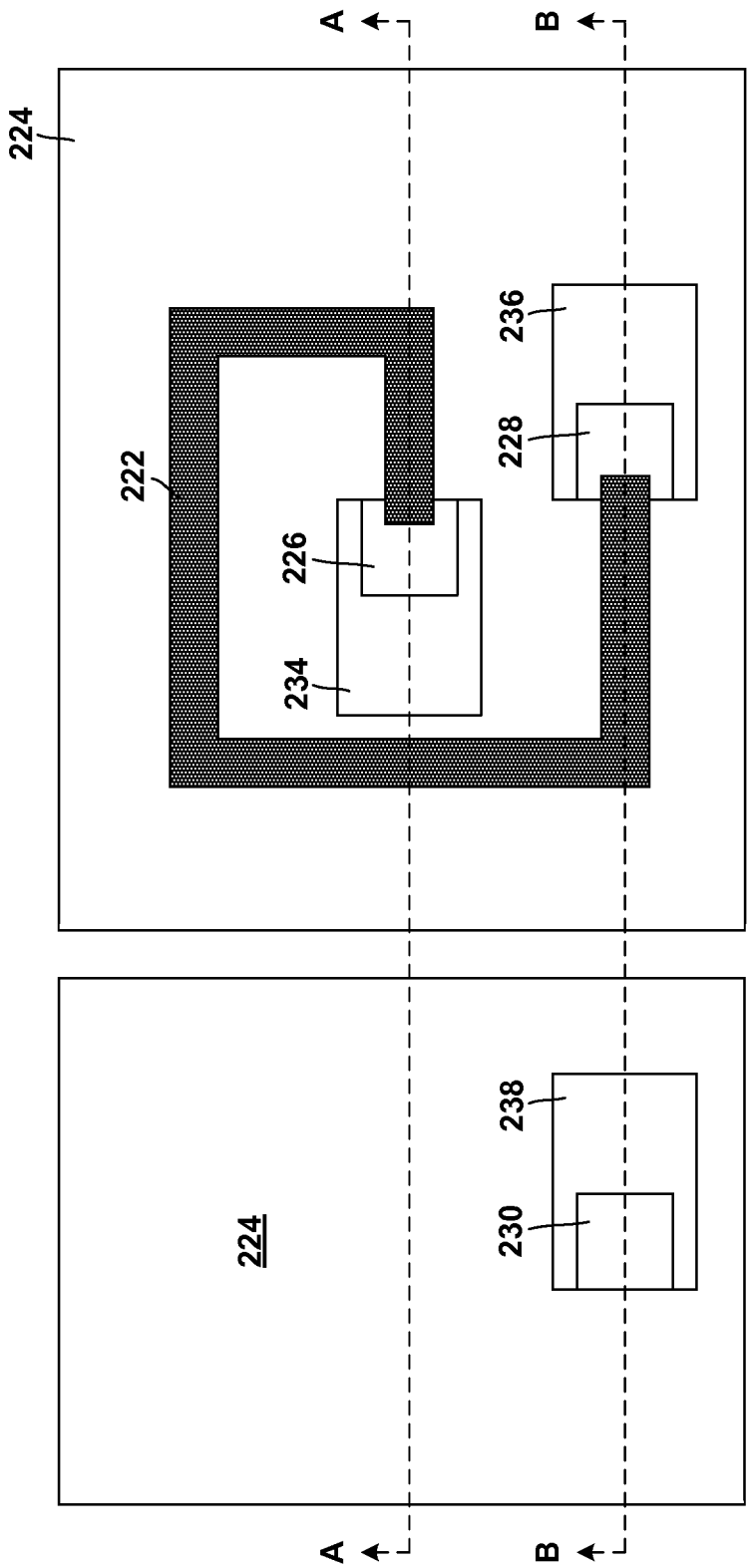
Figure 15:
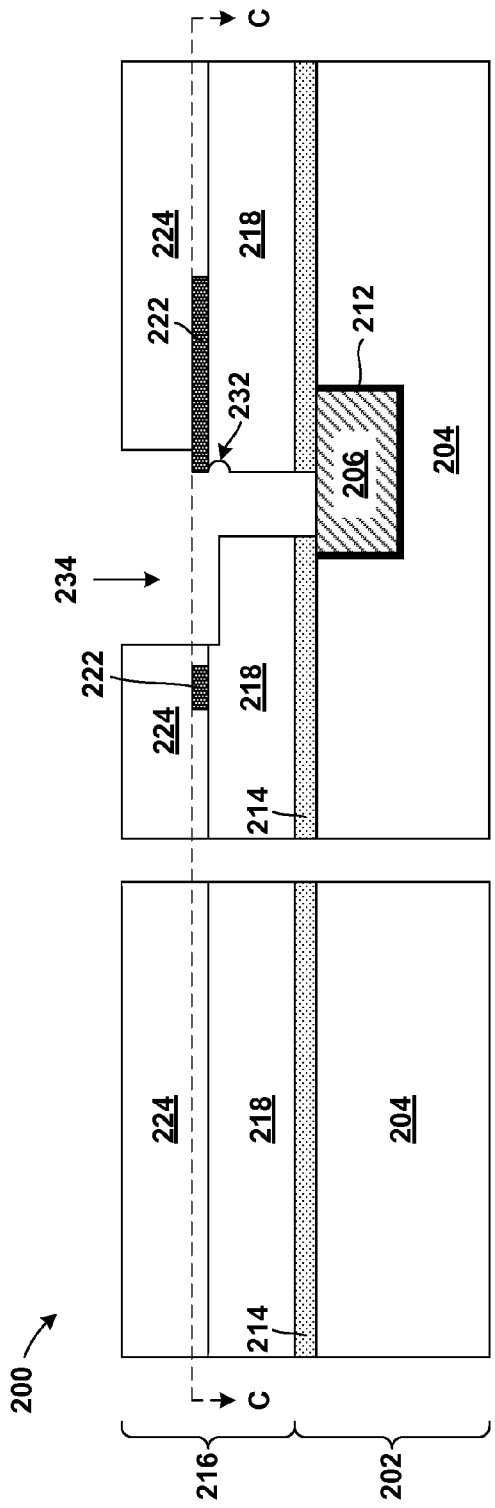
Figure 16:
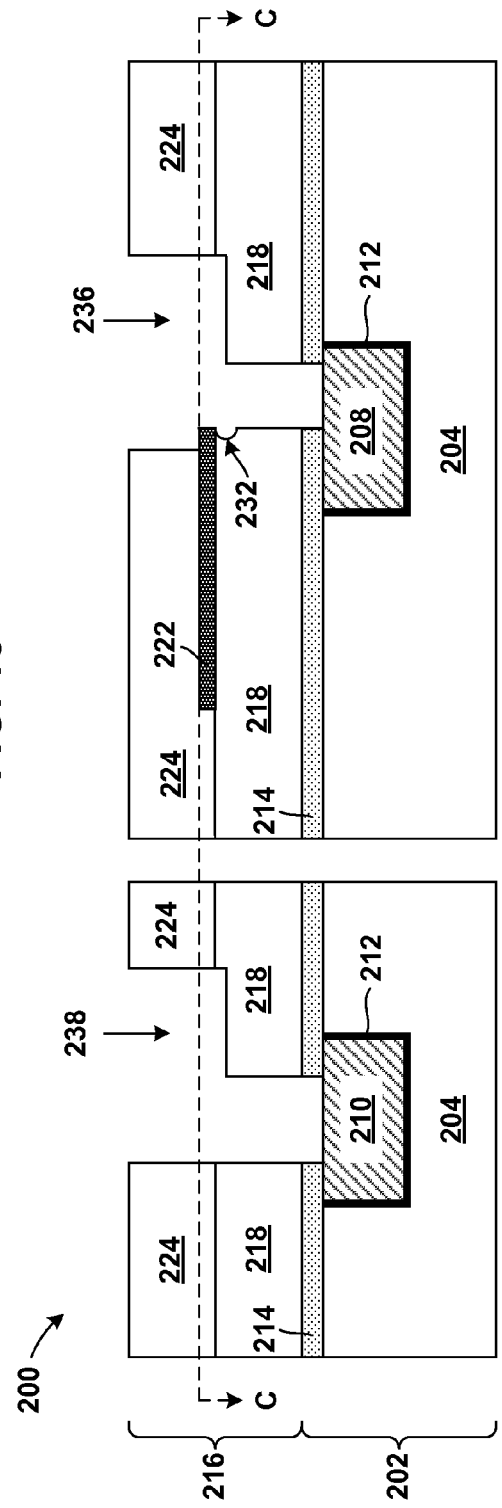

Referring now to FIGS. 14, 15, and 16, a first trench 234, a second trench 236, and a third trench 238 may be formed in the $M_{x+1}$ level 216. FIGS. 15 and 16 are each a cross section view of FIG. 14, section A-A and section B-B, respectively. FIG. 14 is a horizontal cross section view of both FIGS. 15 and 16, section C-C. The first, second, and third trenches 234, 236, 238 may be formed using any suitable masking and etching technique known in the art. In one embodiment, a particular etching technique having selective chemistry may be chosen to etch the first $M_{x+1}$ dielectric 218 and the second $M_{x+1}$ dielectric 224, and further remove the portion of the $M_x$ cap dielectric 214 at the bottom of the via openings (226, 228, 230). Thus, the etching chemistry may preferably etch the first $M_{x+1}$ dielectric 218, the second $M_{x+1}$ dielectric 224, and the $M_x$ cap dielectric 214 selective to the conductive path 222. In one embodiment, for example, a dry etching technique using a fluorine based etchant, for example a $CHF_3$ etchant mixed with oxygen, may be used to etch the first, second, and third trenches 234, 236, 238 and finish etching the via openings 226, 228, 230. The second etching step may cause the undercut feature 232 to grow larger, as depicted in the figure.

Figure 17:
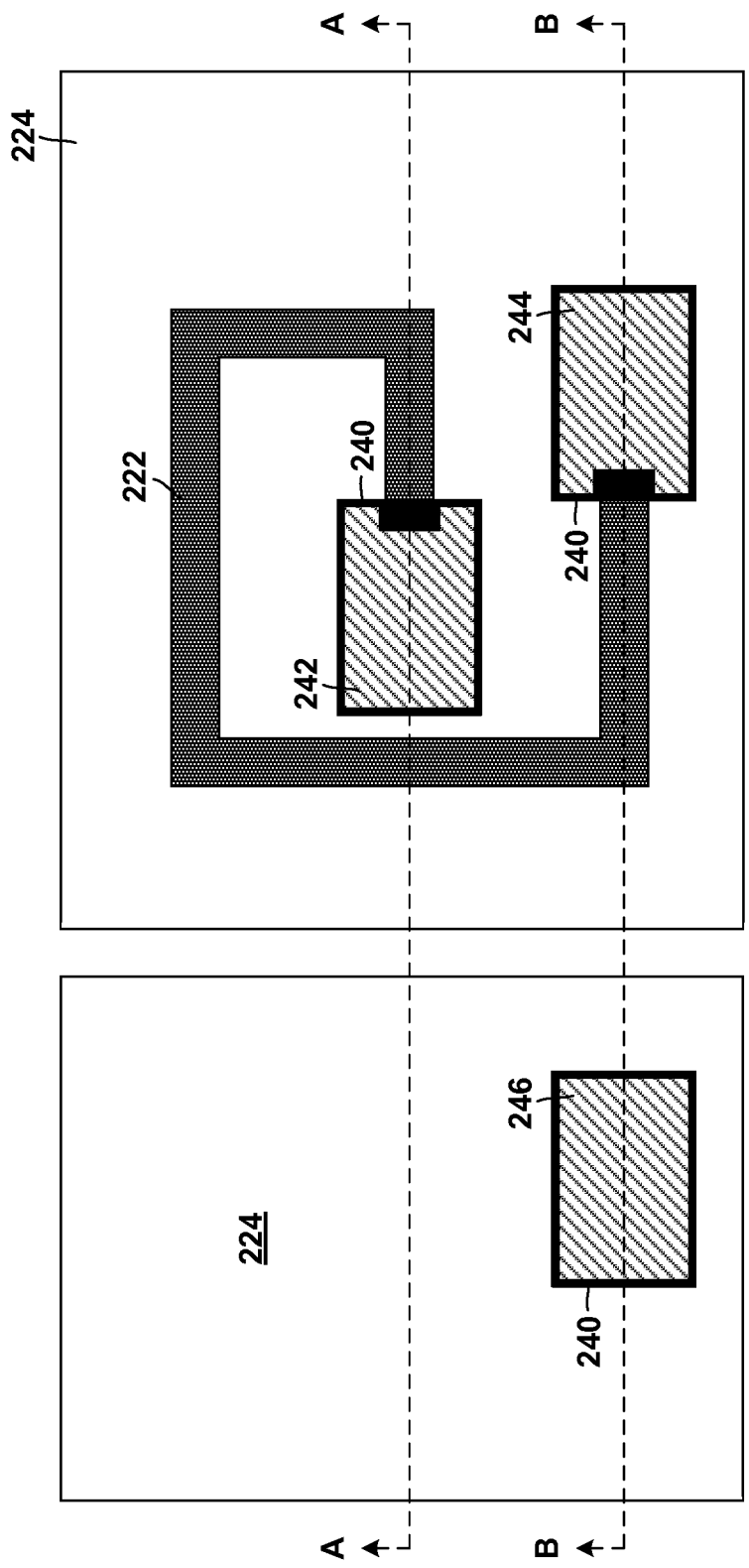

Referring now to FIGS. 17, 18, and 19, the first, second and third trenches 234, 236, 238 (FIG. 14), and the first, second and third via openings 226, 228, 230 (FIG. 14) may be filled with a conductive interconnect material to form a first $M_{x+1}$ metal 242, a second $M_{x+1}$ metal 244, a third $M_{x+1}$ metal 246, a first via 248, a second via 250, and a third via 252. FIGS. 18 and 19 are each a cross section view of FIG. 17, section A-A and section B-B, respectively. FIG. 17 is a horizontal cross section view of both FIGS. 18 and 19, section C-C. The conductive interconnect material used to form the first $M_{x+1}$ metal 242, the second $M_{x+1}$ metal 244, the second $M_{x+1}$ metal 246, the first via 248, the second via 250, and the third via 252 may be substantially similar to that described above with reference to FIG. 2. In one embodiment, the first $M_{x+1}$ metal 242, the second $M_{x+1}$ metal 244, the second $M_{x+1}$ metal 246, the first via 248, the second via 250, and the third via 252 may include various barrier liners, for example, an $M_{x+1}$ liner 240. The $M_{x+1}$ liner 240 may be substantially similar to the $M_x$ liner 212 described above with reference to FIG. 2. Furthermore, a seed layer (not shown) may optionally be deposited, as described above, prior to filling the trenches and via openings with the conductive interconnect material. After filling the first, second and third trenches 234, 236, 238 (FIG. 14), and the first, second and third via openings 226, 228, 230 (FIG. 14) with the conductive interconnect material an $M_{x+1}$ cap dielectric 254 may be deposited on top of the structure 200. A chemical mechanical polishing technique may be applied to ensure complete removal of excess conductive interconnect material prior to depositing the $M_{x+1}$ cap dielectric 254. The $M_{x+1}$ cap dielectric 254 may be substantially similar to the $M_x$ cap dielectric 214 described above with reference to FIG. 2.

Vias, generally, may be used to form electrical connections between the metallization of two interconnect levels. The first via 248 may extend vertically and form a conductive link between the first $M_x$ metal 206 and the first $M_{x+1}$ metal 242. The second via 250 may extend vertically and form a conductive link between second $M_x$ metal 208 and the second $M_{x+1}$ metal 244. The third via 252 may extend vertically and form a conductive link between the third $M_x$ metal 210 and the third $M_{x+1}$ metal 246. The first, second, and third vias 248, 250, 252 may have an aspect ratio of about 4:1 or more, and a diameter or width ranging from about 10 nm to about 40 nm and ranges there between. For example, the vias 248, 250, and 252 may be undersized, or have a width that is sub-ground rule. In the present embodiment, the width of the first and second via openings 226, 228 may be larger at a top than at a bottom, unlike the third via opening with may have a nearly uniform width from top to bottom. The presence of the undercut feature 232 (FIGS. 15, 16) may result in a damaged region 256. The damaged region 256 may include the undercut feature 232 (FIGS. 15, 16). In one embodiment, the damage region 256 may include poor liner coverage and poor seed layer coverage near the undercut feature 232 (FIGS. 15, 16). The poor liner coverage and the poor seed layer coverage may be caused by the unique geometry of the undercut feature 232 (FIGS. 15, 16). Poor liner coverage and poor seed layer coverage may include non-uniform thickness, incomplete coverage, or even small voids in the liner or the seed layer. The small voids in the seed layer, specifically, may be susceptible to electromigration which may grow under an applicable flow of current and other factors such as high current density and heat.

With continued reference to FIGS. 17, 18, and 19, the final e-fuse structure is shown. The left side of the figures represents a non-fuse structure, while the right side of the figures represents the e-fuse structure. Therefore, the first and second $M_x$ metals 206, 208, the first and second vias 248, 250, the first and second $M_{x+1}$ metals 242, 244 along with the conductive path 222 may together form the e-fuse structure. The conductive path 222 may at least partially encircle the first via 248. (See FIGS. 11, 14, 17). In one embodiment, the entire conductive path 222 may be formed within a distance (d) (FIG. 11) ranging from about 100 nm to about 300 nm of the first via 248, and more particularly within a distance (d) ranging from about 150 nm to about 250 nm. Thus the second via 250 may also be formed within the same distance of the first via 248. It should be noted that the resistive heating characteristics (described below) of the conductive path 222 may decrease as the distance between the conductive path 222 and the first via 248 increases. Therefore, optimal heating characteristics may be present when the conductive path 222 is positioned as close to the first via 248 without violation current ground-rule limitations.

In one embodiment, the conductive path 222 may have a width greater than or less than the width of either the first or second via openings 226, 228. (See FIG. 11). Furthermore, each end of the conductive path 222 may extend into, or overlap, either the first via 248 or the second via 250. This overlap may be primarily responsible for the variation in via widths as described above. In one embodiment, the end of the conductive path 222 may overlap with one of the vias (248, 250) by about half of the width of the via. For example, if the first via 248 is about 40 nm wide, one end of the conductive path 222 may overlap with the first via 248 by about 10 nm.

Referring now to FIGS. 20, 21, and 22, the final e-fuse structure is shown after programming. FIGS. 22 and 22 are each a cross section view of FIG. 20, section A-A and section B-B, respectively. FIG. 20 is a horizontal cross section view of both FIGS. 21 and 22, section C-C. In one embodiment, electrons may flow from the second $M_x$ metal 208 through the conductive path 222 to the first $M_{x+1}$ metal 242. In such cases, the second $M_{x+1}$ metal 244 may provide no function related to programming of the e-fuse or otherwise. The conductive path 222 may cause higher resistance and result in localized heating of the first via 248 due to its circular orientation around at least a portion of the first via 248. The height and width of the conductive path 222 may also affect the resistance and heat generated. Therefore, the conductive path 222 may be referred to as a resistive heater. The damaged region 256 (FIGS. 18, 19), including small voids in the seed layer, may further be susceptible to electromigration and result in the formation of a large void 258 in the first via 248. The large void 258 may begin to grow from the damaged region 256 (FIGS. 18, 19), as the conductive interconnect material migrates in the direction of the current. Propagation of the large void 258 may be further encouraged by the heat generated by the high resistance of the conductive path 222. This configuration may provide more consistency and reliability during programming of the e-fuse because the large void 258, or open circuit, may occur at lower programming currents and shorter programming times. The lower programming currents and shorter programming times may be achieved by the introduction of the damaged region 256 (FIGS. 18, 19), and the heating of the first via 248. The damaged region 256 (FIGS. 18, 19) and increased heating of the first via 248 may enhance electromigration, and thereby encouraging faster e-fuse programming at lower currents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming an electronic fuse, the method comprising:
    forming an $M_x$ level comprising a first $M_x$ metal, and a second $M_x$ metal;
    forming a first $M_{x+1}$ dielectric above the $M_x$ level;
    forming a conductive path on a portion of the first $M_{x+1}$ dielectric above the first $M_x$ metal and above the second $M_x$ metal;
    forming a second $M_{x+1}$ dielectric above the first $M_{x+1}$ dielectric and above the conductive path, wherein the first $M_{x+1}$ dielectric and the second $M_{x+1}$ dielectric together form an $M_{x+1}$ level;
    forming a first via and a second via in the $M_{x+1}$ level, the conductive path extending from the first via to the second via and partially encircling the first via; and
    forming a first $M_{x+1}$ metal and a second $M_{x+1}$ metal in the $M_{x+1}$ level, the first via extending vertically and electrically connecting the first $M_x$ metal to the first $M_{x+1}$ metal, and the second via extending vertically and electrically connecting the second $M_x$ metal to the second $M_{x+1}$ metal.

2. The method of claim 1, wherein forming the conductive path on the portion of the first $M_{x+1}$ dielectric above the first $M_x$ metal and above the second $M_x$ metal comprises:
    forming the conductive path within a distance ranging from about 100 nm to about 300 nm of the first via.

3. The method of claim 1, wherein forming the conductive path on the portion of the first $M_{x+1}$ dielectric above the first $M_x$ metal and above the second $M_x$ metal comprises:
    forming the conductive path comprising a width ranging from about 20 nm to about 40 nm.

4. The method of claim 1, wherein forming the conductive path on the portion of the first $M_{x+1}$ dielectric above the first $M_x$ metal and above the second $M_x$ metal comprises:
    forming the conductive path comprising a thickness ranging from about 2 nm to about 5 nm.

5. The method of claim 1, wherein forming the conductive path on the portion of the first $M_{x+1}$ dielectric above the first $M_x$ metal and above the second $M_x$ metal comprises:
    depositing a conductive layer comprising a thickness ranging from about 2 nm to about 5 nm; and
    removing a portion of the conductive layer to form the conductive path.

6. The method of claim 1, wherein forming the conductive path on the portion of the first $M_{x+1}$ dielectric above the first $M_x$ metal and above the second $M_x$ metal comprises:
    depositing a metal having a different etch rate than the first $M_{x+1}$ dielectric under the same etch conditions.

7. The method of claim 1, wherein forming the first via and the second via in the $M_{x+1}$ level comprises:
    forming the first and second vias comprising a width ranging from about 10 nm to about 40 nm.

8. The method of claim 1, wherein forming the first via and the second via in the $M_{x+1}$ level comprises:
    forming a damaged region comprising an undercut feature and poor liner coverage.

9. The method of claim 1, further comprising:
    applying a programming current from the second $M_x$ metal to the first $M_{x+1}$ metal through the conductive path.

10. A method of forming an electronic fuse, the method comprising:

forming an $M_x$ level comprising a first $M_x$ metal, and a second $M_x$ metal;

forming a first $M_{x+1}$ dielectric above the $M_x$ level;

forming a conductive layer on top of the first $M_{x+1}$ dielectric above the first $M_x$ metal and above the second $M_x$ metal;

forming a conductive path on a portion of the first $M_{x+1}$ dielectric above the first $M_x$ metal and above the second $M_x$ metal by patterning the conductive layer;

forming a second $M_{x+1}$ dielectric above the first $M_{x+1}$ dielectric and above the conductive path, wherein the first $M_{x+1}$ dielectric and the second $M_{x+1}$ dielectric together form an $M_{x+1}$ level;

forming a first via and a second via in the $M_{x+1}$ level, the conductive path extending from the first via to the second via and partially encircling the first via; and forming a first $M_{x+1}$ metal and a second $M_{x+1}$ metal in the $M_{x+1}$ level, the first via extending vertically and electrically connecting the first $M_x$ metal to the first $M_{x+1}$ metal, and the second via extending vertically and electrically connecting the second $M_x$ metal to the second $M_{x+1}$ metal.

11. The method of claim 10, wherein forming the conductive path on the portion of the first $M_{x+1}$ dielectric above the first $M_x$ metal and above the second $M_x$ metal comprises:

forming the conductive path within a distance ranging from about 100 nm to about 300 nm of the first via.

12. The method of claim 10, wherein forming the conductive path on the portion of the first $M_{x+1}$ dielectric above the first $M_x$ metal and above the second $M_x$ metal comprises:

forming the conductive path comprising a width ranging from about 20 nm to about 40 nm.

13. The method of claim 10, wherein forming the conductive path on the portion of the first $M_{x+1}$ dielectric above the first $M_x$ metal and above the second $M_x$ metal comprises:

forming the conductive path comprising a thickness ranging from about 2 nm to about 5 nm.

14. The method of claim 10, wherein forming the conductive path on the portion of the first $M_{x+1}$ dielectric above the first $M_x$ metal and above the second $M_x$ metal comprises:

depositing a metal having a different etch rate than the first $M_{x+1}$ dielectric under the same etch conditions.

15. The method of claim 10, wherein forming the first via and the second via in the $M_{x+1}$ level, the conductive path extending from the first via to the second via and partially encircling the first via comprises:

forming the first and second vias comprising a width ranging from about 10 nm to about 40 nm.

16. The method of claim 10, wherein forming the first via and the second via in the $M_{x+1}$ level comprises:

forming a damaged region comprising an undercut feature and poor liner coverage.

17. The method of claim 10, further comprising:

applying a programming current from the second $M_x$ metal to the first $M_{x+1}$ metal through the conductive path.

\* \* \* \* \*